US006730843B2

(12) United States Patent
Kawanishi

(10) Patent No.: US 6,730,843 B2
(45) Date of Patent: May 4, 2004

(54) OPTICAL LINKAGE DEVICE

(75) Inventor: Yasuyuki Kawanishi, Osaka (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 10/385,911

(22) Filed: Mar. 11, 2003

(65) Prior Publication Data

US 2003/0173101 A1 Sep. 18, 2003

(30) Foreign Application Priority Data

Mar. 14, 2002 (JP) ........................................ 2002-070447

(51) Int. Cl.[7] .............................. H02G 3/08; H05K 5/00
(52) U.S. Cl. ..................... 174/52.1; 361/752; 361/782
(58) Field of Search ......................... 174/52.1; 361/807, 361/811, 782, 752

(56) References Cited

U.S. PATENT DOCUMENTS

| 3,974,441 A | * | 8/1976 | Van Den Haak ............ 324/433 |
| 4,331,995 A | * | 5/1982 | Voss ............................. 361/85 |
| 4,622,541 A | * | 11/1986 | Stockdale .................... 340/566 |
| 5,040,407 A | * | 8/1991 | Hinckley et al. ................. 73/2 |
| 5,729,025 A | * | 3/1998 | Erickson et al. ............ 250/574 |

* cited by examiner

*Primary Examiner*—Hung V. Ngo
(74) *Attorney, Agent, or Firm*—Fish & Richardson P.C.

(57) ABSTRACT

An optical linkage device includes a trimmable resistance for controlling output characteristics of a laser diode; a board having the trimmable resistance mounted thereon; and a case at least covering the board, the case provided with an adjustment hole for adjustment of a resistance value of the trimmable resistance. This arrangement permits the adjustment of the output of the laser diode to be performed with the case fixed to place. Thus is provided the optical linkage device capable of maintaining a more stable product quality.

2 Claims, 2 Drawing Sheets

OPTICAL LINKAGE DEVICE

This application is based on application No. 2000-270447 filed in Japan, the content of which is incorporated herein by reference.

BACKGROUND OF THE INVENTION

1. Field of the Invention

The present invention relates to an optical linkage device for use in optical transmission apparatus such as a medium converter, the optical linkage device operative to convert an electrical signal into an optical signal.

2. Description of the Related Art

The optical linkage device employs a laser diode which is significantly varied in output characteristics thereof and hence, the fabricated optical linkage device requires adjustment for the output of the laser diode before shipping.

According to the conventional practice, adjustment of a trimmable resistance on a board is made in a state where a case of the optical linkage device is opened or where the board is dismounted from the case, and then the case is mounted to place to complete the optical linkage device.

After the adjustment, however, the fixing of the case may cause the variation of internal temperature conditions of the linkage device. Consequently, the conventional technique cannot obviate the variations of laser output characteristics associated with the increased internal temperature of the fabricated optical linkage device.

BRIEF SUMMARY OF THE INVENTION

It is an object of the invention to provide an optical linkage device which permits the adjustment of output of a light emitting element to be performed with the case fixed to place thereby ensuring a more stable product quality.

In accordance with the invention, an optical linkage device comprises: a light emitting element; a trimmable resistance for controlling output characteristics of the light emitting element; a board having the trimmable resistance mounted thereon; and a case at least covering the board, wherein the case is provided with an adjustment hole for adjustment of a resistance value of the trimmable resistance.

According to the above arrangement, the resistance value of the trimmable resistance can be controlled by adjusting an adjustable member via the adjustment hole in a state where the case is mounted on the board.

In a case where a substantial distance cannot be attained between the case and the board, a distal end of the adjustable member of the trimmable resistance may be positioned at some intermediate point relative to a thickness of the case. In this case, a distance between an inside surface of the case and the board is relatively decreased so that the whole body of the optical linkage device can be reduced in size.

In another feature of the invention, the adjustment hole may be formed in a top surface of the case. Where the optical linkage device is mounted to a housing of a higher rank unit such as a medium converter, the adjustment can be performed via the top surface of the case if space above the top surface of the case is available.

In another feature of the invention, the adjustment hole may be formed in a lateral side of the case. In a case where there is no space available above the top surface of the case and an available space is provided only laterally of the case, the adjustment may be performed via the lateral side of the case.

In another feature of the invention, a ventilating through-hole may be provided at any one of the board, the top surface of the case and the lateral side of the case. In this case, the adjustment hole and ventilating through-hole may serve as heat releasing holes capitalizing on convective air flow. Thus, heat release efficiency is increased so that performance deterioration associated with elevated temperatures is prevented.

As described above, the invention permits the resistance value of the trimmable resistance to be controlled via the adjustment hole with the case assembled in place. Therefore, the output characteristics of the optical linkage device can be adjusted in a like state to an actual operation environment.

Hereinafter, a specific constitution of the invention will be described with reference to the accompanying drawings.

BRIEF DESCRIPTION OF THE DRAWINGS

FIG. 3 is an enlarged sectional view showing a positional relation between a screw 2 and the adjustment hole 1a.

DETAILED DESCRIPTION OF THE INVENTION

Figure 1:
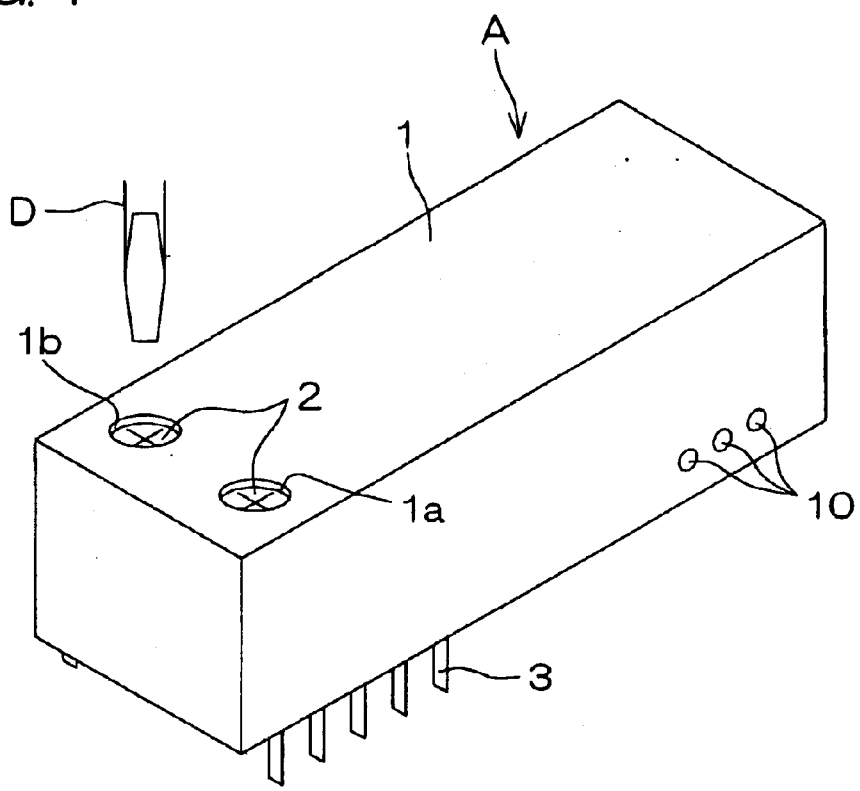
FIG. 1 is a perspective view showing an optical linkage device according to the invention.

FIG. 1 is a perspective view showing an optical linkage device A according to the invention. The optical linkage device A includes a metal case 1 formed with adjustment holes 1a, 1b, and a board contained in the metal case 1. A trimmable resistance with movable contact is mounted on the board, whereas screws 2 as an adjustable member of the trimmable resistance are exposed under the adjustment holes 1a, 1b of the metal case 1. A reference numeral 3 denotes a board connecting terminals, whereas a reference sign D denotes a driver for turning the screw. The metal case 1 is constructed from aluminum or stainless steel for shielding property. However, the material for the case 1 is not limited to the metal and may also include a conductive plastic material.

Figure 2:
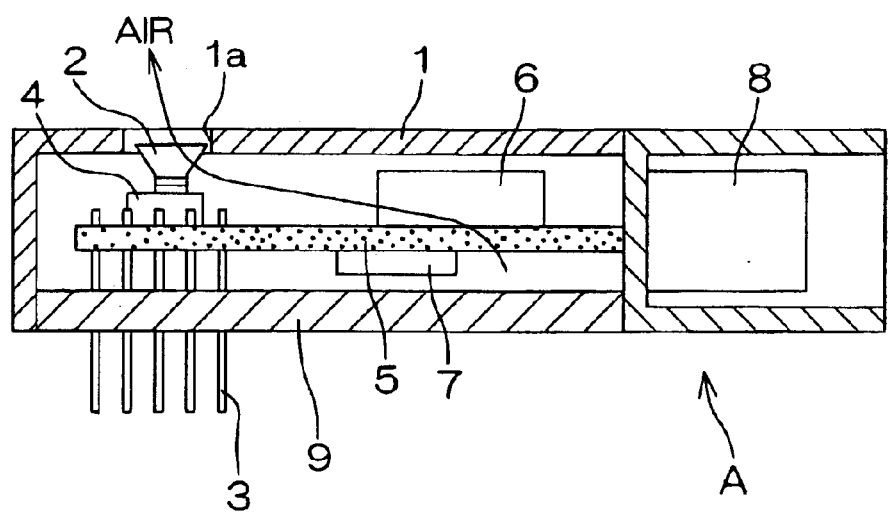
FIG. 2 is a vertical sectional view taken along a line intersecting an adjustment hole 1a of the optical linkage device.

FIG. 2 is a vertical sectional view taken along a line intersecting the adjustment hole 1a. The metal case 1 defines a rectangular parallelepiped structure including a top surface and lateral side faces. The metal case 1 has a resin plate 9 fitted in a bottom aperture thereof. The metal case 1 contains therein a board 5, which has a trimmable resistance 4 mounted thereon. The screw 2 as the adjustable member used for setting a resistance value of the trimmable resistance 4 is located beneath the adjustment hole 1a of the metal case 1. Reference numerals 6, 7 denote circuit components mounted on the board 5, whereas a numeral 8 denotes a laser diode supplied with an electric power via the board 5.

Figure 3:
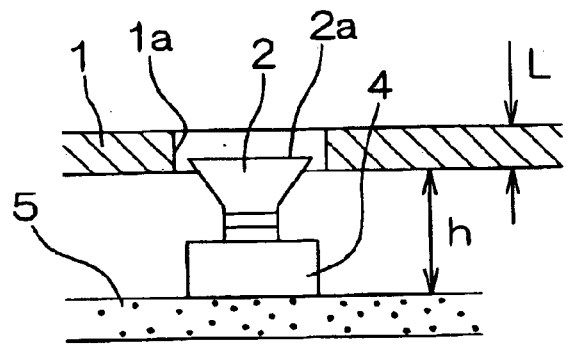

FIG. 3 is an enlarged sectional view showing a positional relation between the screw 2 and the adjustment hole 1a. A flat top face 2a of the screw 2 is located at some intermediate point relative to a thickness 'L' of the metal case 1. Therefore, the metal case 1 can be reduced in height 'h' from the board 5, resulting in the size reduction of the whole body of the optical linkage device.

Additionally, a ventilating through-hole may be provided at the board 5, the resin plate 9 or the top surface or lateral side of the metal case 1. FIG. 1 shows ventilating through-holes 10 formed in a lateral side of the metal case 1. The provision of the ventilating through-holes 10 provides free air flow between the ventilating through-holes 10 and the adjustment hole 1a, permitting heat generated in the metal case 1 to be dissipated.

In the forgoing embodiment, the adjustment holes are formed in the top surface of the metal case 1. However, the adjustment holes may be formed in the lateral side of the metal case 1 in a case where it is difficult to set a resistance value via the top surface of the metal case 1.

Figure 4:
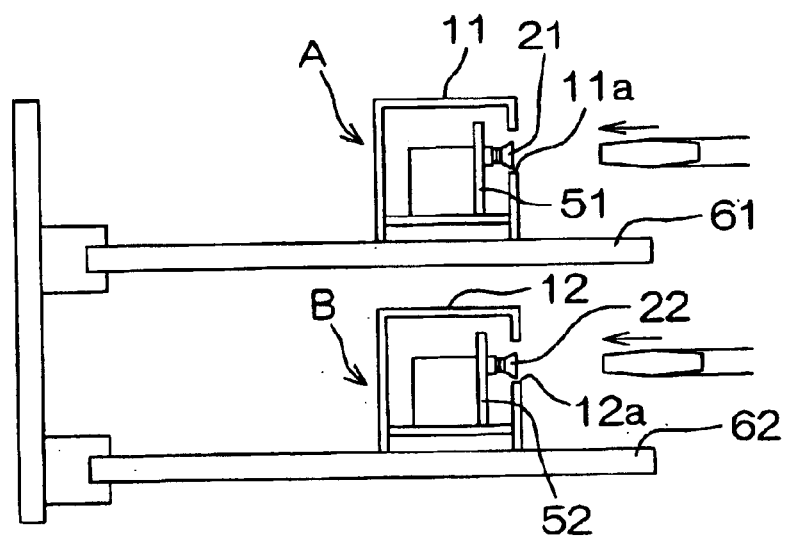
FIG. 4 is a side elevation showing an example of a medium converter wherein boards 61, 62 are arranged in two steps and have optical linkage devices A, B mounted thereon, respectively.

FIG. 4 is a side elevation showing an example of a medium converter wherein boards 61, 62 are arranged in two steps and have optical linkage devices A, B mounted thereon, respectively. Optical linkage devices A, B have an adjustment hole 11a, 12a at a lateral side of a metal case 11, 12 thereof, respectively. Each screw 21, 22 for setting a resistance value of each trimmable resistance mounted on each board 51, 52 contained in each metal case 11, 12 is exposed via each adjustment hole 11a, 12a.

Where the boards 61, 62 of the medium converter obstruct the adjustment from above, an effective approach is to provide the adjustment holes 11a, 12a at the respective lateral sides of the metal cases 11, 12 of the optical linkage devices A, B, as shown in FIG. 4.

Although the preferred embodiments of the invention have been fully described, it is to be understood that the mode for carrying out the invention is not limited to the above. For instance, the adjustable member of the trimmable resistance may employ any other member such as a slide lever in place of the screw. In this case, the metal case may be formed with an elongate slot through which a bar for moving the slide lever is extended. Although the foregoing embodiments illustrate the laser diode as a light emitting element, other elements such as a plasma light emitting device and LED may also be used.

There is a fear that the set adjustable member of the trimmable resistance may inadvertently be moved by a user. This fear may be eliminated by molding the set adjustable member in a resin.

It is claimed:

1. An optical linkage device mounted on a board in an optical transmission apparatus, comprising a light emitting element; a trimmable resistance for controlling output characteristics of the light emitting element; the board having the trimmable resistance mounted thereon; and a case at least covering the board, wherein a top surface of the case is provided with an adjustment hole for adjustment of a resistance value of the trimmable resistance, wherein a distal end of an adjustable member of the trimmable resistance is located at an intermediate point relative to a thickness of the case and the adjustable member is not in contact with the case, and a ventilating through-hole is provided at any one of the board, the top surface of the case and a lateral side of the case.

2. An optical linkage device mounted on a board in an optical transmission apparatus, comprising a light emitting element; a trimmable resistance for controlling output characteristics of the light emitting element; the board having the trimmable resistance mounted thereon; and a case at least covering the board, wherein a lateral side of the case is provided with an adjustment hole for adjustment of a resistance value of the trimmable resistance, wherein a distal end of an adjustable member of the trimmable resistance is located at some intermediate point relative to a thickness of the case and the adjustable member is not in contact with the case, and a ventilating through-hole is provided at any one of the board, a top surface of the case and the lateral side of the case.

* * * * *